United States Patent
Shoji et al.

(10) Patent No.: US 9,036,358 B2
(45) Date of Patent: May 19, 2015

(54) TERMINAL DEVICE AND TRANSPARENT SUBSTRATE

(71) Applicant: SONY MOBILE COMMUNICATIONS AB, Lund (SE)

(72) Inventors: Hideaki Shoji, Tokyo (JP); Atsushi Takei, Tokyo (JP)

(73) Assignees: Sony Corporation, Tokyo (JP); Sony Mobile Communications AB, Lund (SE)

( * ) Notice: Subject to any disclaimer, the term of this patent is extended or adjusted under 35 U.S.C. 154(b) by 222 days.

(21) Appl. No.: 13/667,562

(22) Filed: Nov. 2, 2012

(65) Prior Publication Data

US 2013/0165189 A1 Jun. 27, 2013

Related U.S. Application Data

(60) Provisional application No. 61/580,571, filed on Dec. 27, 2011.

(51) Int. Cl.
*H05K 1/00* (2006.01)
*G06F 1/16* (2006.01)
*H05K 1/02* (2006.01)
*H04M 1/02* (2006.01)

(52) U.S. Cl.
CPC .............. *G06F 1/16* (2013.01); *H05K 1/0296* (2013.01); *H04M 1/0277* (2013.01); *G06F 1/1656* (2013.01)

(58) Field of Classification Search
USPC .................. 361/679.02, 749–751; 455/575.1; 174/255, 256, 260, 261
See application file for complete search history.

(56) References Cited

U.S. PATENT DOCUMENTS

| | | | | |
|---|---|---|---|---|
| 4,296,424 | A * | 10/1981 | Shibasaki et al. | 338/32 R |
| 7,646,941 | B2 * | 1/2010 | Danielson et al. | 382/313 |
| 7,983,721 | B2 * | 7/2011 | Ying et al. | 455/575.1 |
| 8,570,225 | B2 * | 10/2013 | Shoji et al. | 343/702 |
| 2002/0018169 | A1 | 2/2002 | Kato | |
| 2004/0203493 | A1 * | 10/2004 | Carlson | 455/90.1 |
| 2004/0204125 | A1 * | 10/2004 | Messel et al. | 455/566 |
| 2004/0239575 | A1 * | 12/2004 | Shoji et al. | 343/770 |
| 2005/0073829 | A1 * | 4/2005 | Burger et al. | 362/84 |
| 2007/0287503 | A1 * | 12/2007 | Ying et al. | 455/566 |
| 2008/0129531 | A1 * | 6/2008 | Messel et al. | 340/815.45 |
| 2008/0192500 | A1 * | 8/2008 | Kaito | 362/603 |

(Continued)

FOREIGN PATENT DOCUMENTS

JP 2005-267897 9/2005

OTHER PUBLICATIONS

Extended European Search Report issued May 2, 2013, in European Patent Application No. 12194047.2.

(Continued)

*Primary Examiner* — Adrian S Wilson
(74) *Attorney, Agent, or Firm* — Oblon, McClelland, Maier & Neustadt, L.L.P.

(57) ABSTRACT

A transparent substrate including a transmissive electrode area including a plurality of wiring line portions arranged side by side on a substrate formed of a transparent material, a width of each of the wiring line portions being set in accordance with a current to flow through the wiring line portion; and a non-transmissive electrode area disposed on the substrate, the non-transmissive electrode being connected to the wiring line portions of the transmissive electrode area.

16 Claims, 12 Drawing Sheets

(56) References Cited

U.S. PATENT DOCUMENTS

| | | | |
|---|---|---|---|
| 2009/0176534 A1* | 7/2009 | Lee et al. | 455/566 |
| 2010/0073242 A1* | 3/2010 | Vazquez et al. | 343/702 |
| 2010/0200286 A1* | 8/2010 | Melcher et al. | 174/261 |
| 2011/0074608 A1* | 3/2011 | Kawamura | 341/22 |
| 2011/0165916 A1* | 7/2011 | Park et al. | 455/566 |
| 2011/0237309 A1* | 9/2011 | Shoji et al. | 455/575.1 |
| 2012/0031487 A1* | 2/2012 | Kuang et al. | 136/256 |
| 2012/0077548 A1* | 3/2012 | Goldberg | 455/567 |
| 2013/0162124 A1* | 6/2013 | Miyaoka et al. | 312/223.1 |

OTHER PUBLICATIONS

Admin: "Sony Ericsson Nozomi LT26i", XP-055060228, URL:http://www.mypocketpc.ch/2011/12/23/sony-ericsson-nozomi-lt26i/, Dec. 23, 2011, 2 pages.

XB: "Sony Ericsson LT26i Nozomi high-res images-leak", XP-055060124, URL:http://www.xperiablog.net/2011/1212/sony-ericsson-lt26i-nozomi-high-res-images-leak/, Dec. 12, 2011, 11 pages.

Jamie Pert, "Sony Ericsson Xperia Nozomi LT26i first looks at specs & design", XP-055060127, URL:http//www.product-reviews.net/2011/11/07/sony-ericsson-xperia-nozomi-lt26i-first-looks-at-specs-desiqn/, Nov. 7, 2011, 5 pages.

XB: "Black Sony Ericsson LT26i Nozomi spotted in the wild", XP-055060126, URL:http://www.xperiabloci.net/2011/12/07/black-sony-ericsson-lt26i-nozomi-spotted-in-the-wild/, Dec. 7, 2011, 9 pages.

"Nozomi Xperia LT26i leaked", XP-055060123, URL:http://talk.sonymobile.com/thread/28162?start=0&tstart=0, Dec. 7, 2011, 3 pages.

* cited by examiner

TERMINAL DEVICE AND TRANSPARENT SUBSTRATE

CROSS REFERENCE TO RELATED APPLICATION

The present application claims the benefit of the earlier filing date of U.S. Provisional Patent Application Ser. No. 61/580,571 filed on Dec. 27, 2011, the entire contents of which is incorporated herein by reference.

BACKGROUND

The present disclosure relates to a terminal device and a transparent substrate.

FIELD OF THE DISCLOSURE

Today, there are electronic devices having a housing, part of which is transparent so as to realize well-designed electronic devices.

DESCRIPTION OF RELATED ART

Japanese Unexamined Patent Application Publication No. 2005-267897 describes a display device equipped with a display panel. Part of a housing of the display device is formed of transparent resin.

Generally, when a portion of a housing is transparent, components or the like are not disposed in the transparent portion of the housing. That is, when, for example, electrical wiring is disposed in the transparent portion, the wiring is visible from the outside. It is an undesirable situation. In related art, transparent electrodes, which are electrodes formed of a light transmissive material, are in practical use and applied to liquid crystal display panels, touch panels, and the like.

However, it is difficult for transparent electrodes to allow a large current to flow therethrough compared to typical wiring materials such as copper and aluminum, and accordingly, it is difficult to use transparent electrodes as part of general wiring materials.

Thus, when part of a housing is transparent in the related art, wiring routed in the housing has not been disposed at positions where the housing is transparent.

SUMMARY

Inventors recognize that it is desirable that part of the housing of the terminal device be made transparent, and that wiring be preferably disposed at the transparent part.

According to a first exemplary embodiment, the disclosure is directed to an information processing apparatus comprising: a first housing; a second housing; a transparent member disposed between the first and second housings; and a transparent substrate including a transmissive electrode area having a wiring line portion electrically connecting an interior of the first housing and an interior of the second housing, the wiring line portion having a width set based on a current flow through the wire line portion.

According to another exemplary embodiment, the disclosure is directed to a transparent substrate including a transmissive electrode area including a plurality of wiring line portions arranged side by side on a substrate formed of a transparent material, a width of each of the wiring line portions being set in accordance with a current to flow through the wiring line portion; and a non-transmissive electrode area disposed on the substrate, the non-transmissive electrode being connected to the wiring line portions of the transmissive electrode area.

According to the embodiment of the present disclosure, the widths of wiring components disposed as the transmissive electrode area are set in accordance with currents to flow through the wiring line portions. Thus, the wiring line portions through which a comparatively high currents need to flow can be preferably disposed as the transmissive electrode area.

DETAILED DESCRIPTION

An example of a terminal device and a transparent member holding mechanism according to an embodiment of the present disclosure will be described hereafter with reference to the drawings in the following order.
1. Outer Shape of Terminal Device (FIG. 1)
2. Configuration of Terminal Device (FIG. 2)
3. Structure for Connecting First Housing to Second Housing (FIGS. 3 to 6)
4. Connection Structure using Transparent Flexible Substrate (FIGS. 7 to 10)
5. Illumination State of Transparent Portion (FIGS. 11 and 12)
6. Modifications

[1. Outer Shape of Terminal Device]

Figure 1:
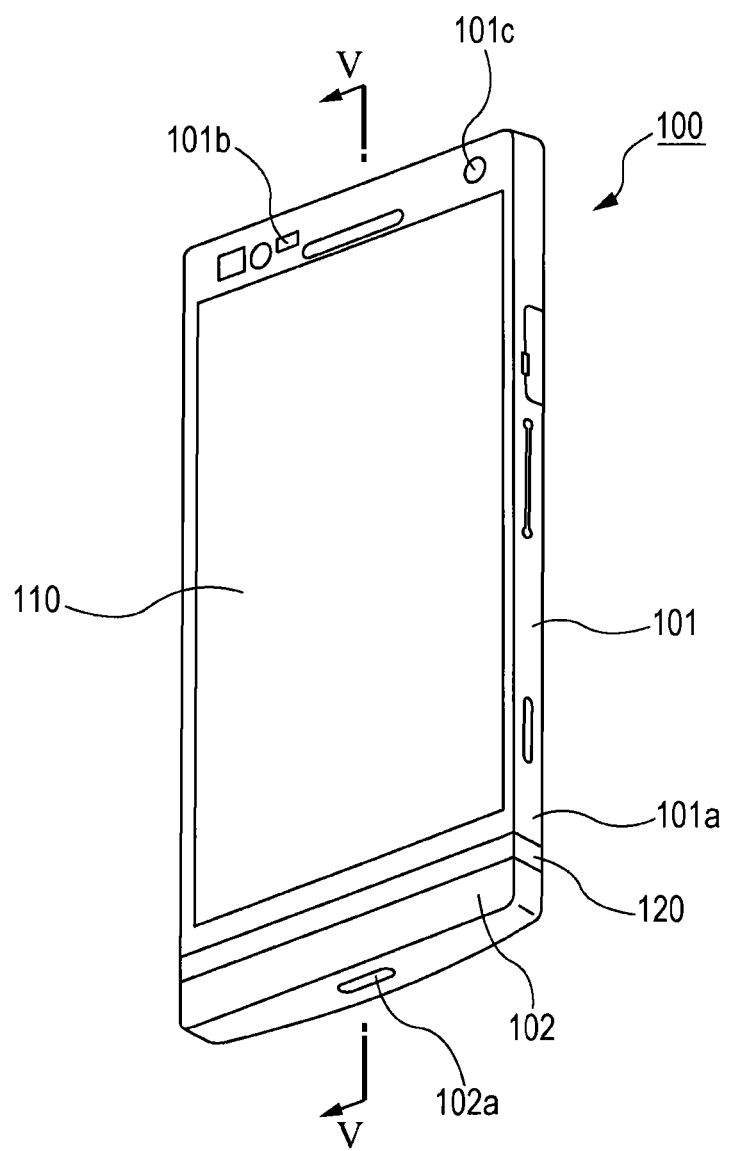
FIG. 1 is a perspective view illustrating an example of the shape of a terminal device of an embodiment according to the present disclosure.

FIG. 1 illustrates the structure of a terminal device of an example of an embodiment according to the present disclosure.

A terminal device 100 illustrated in FIG. 1 is a mobile phone terminal device, which is a so-called smart phone.

The terminal device 100 includes a first housing 101 and a second housing 102. The first housing 101 includes a display unit 110 and electronic circuitry. The display unit 110 is disposed in a surface of the first housing 101, and the electronic circuitry, which is part of the mobile phone terminal device, is disposed inside the first housing 101. The display unit 110 uses a display panel such as a liquid crystal display panel or an organic EL (electroluminescence) display panel. A touch panel is incorporated in the display panel provided in the display unit 110.

A transparent member 120 is connected to a lower portion 101*a* of the first housing 101, and the second housing 102 is connected to a lower portion of the transparent member 120. The transparent member 120 extends along the entire lateral width of the first housing 101 and the second housing 102. Thus, the first housing 101 and the second housing 102 are spaced apart by a gap of a certain distance therebetween in the terminal device 100. The second housing 102 is a small component that houses an antenna, a microphone, and a vibrator.

A microphone mounting portion 102*a* is formed at a lower end portion of the second housing 102.

A speaker mounting portion 101*b* and a camera mounting portion 101*c* are disposed at an upper end portion of the first housing 101. A speaker and a camera unit are disposed in the respective mounting portions 101*b* and 101*c* inside the first housing 101.

The touch panel provided in the display unit 110 has characteristics by which a touch is detected in an area slightly larger than a display area of the display panel near the lower portion 101*a* of the first housing 101. For example, even when a user touches a position that is slightly under an image display area of the display panel and is in contact with the transparent member 120, the operation by the user is detected by the touch panel.

[2. Configuration of Terminal Device]

Figure 2:
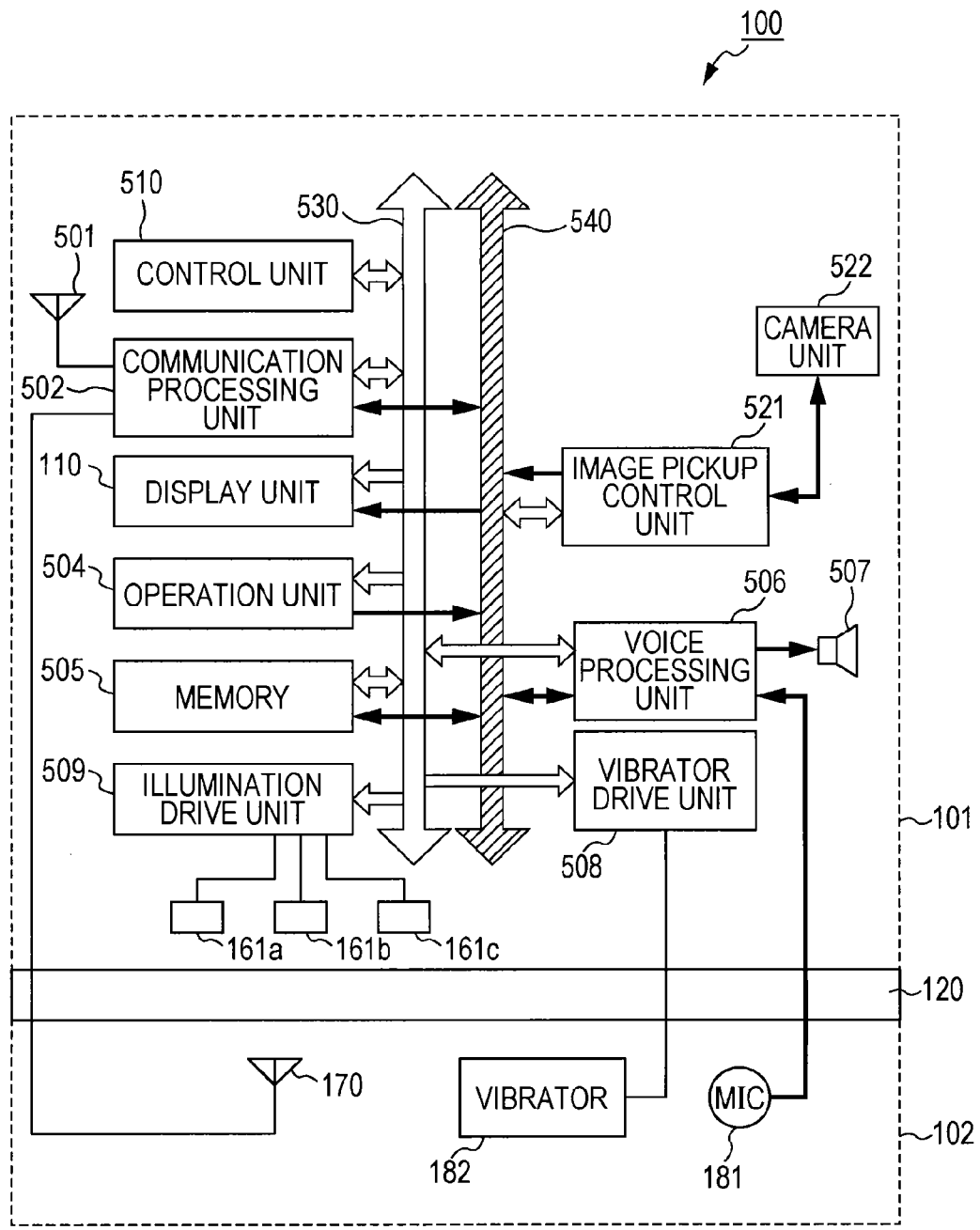
FIG. 2 is a block diagram illustrating an example of the structure of the terminal device of the embodiment according to the present disclosure.

Next, the configuration inside the terminal device 100 will be described with reference to FIG. 2.

As described above, the terminal device 100 includes the first housing 101 and the second housing 102. Some electronic components are disposed in the second housing 102.

The terminal device 100, which is a mobile phone terminal, includes an antenna 501 and an antenna member 170 as antennas that transmit and receive electric waves to and from a radiotelephone base station. The antenna 501 is disposed in the first housing 101 and the antenna member 170 is disposed in the second housing 102. An antenna in the antenna member 170 and the antenna 501 are connected to a communication processing unit 502.

The communication processing unit 502 performs radio communication with a radiotelephone base station under the control of a control unit 510. In voice communication, the communication processing unit 502 supplies voice data included in received data to a voice processing unit 506. The voice processing unit 506 decodes the supplied voice data to obtain an analog voice signal. The analog voice signal obtained in the voice processing unit 506 is supplied to a speaker 507. The speaker 507 outputs voice in accordance with the received analog voice signal.

A microphone 181 that picks up voice is also provided. The voice signal output from the microphone 181 is supplied to the voice processing unit 506. The microphone 181 is disposed in the second housing 102. The voice processing unit 506 encodes the received voice signal into voice data using a specified encoding scheme. The voice processing unit 506 supplies the encoded voice data to the communication processing unit 502. The communication processing unit 502 converts the supplied voice data into a packet format for transmission and modulates the data for transmission. The communication processing unit 502 supplies the modulated transmission signal to the antenna 501 or the antenna in the antenna member 170 and the modulated transmission signal is then radiated as radio waves.

Processing units such as a communication processing unit 502 and a voice processing unit 506 transmit and receive control data to and from the control unit 510 through a control line 530 and transmit data through a data line 540.

The terminal device 100 also includes the display unit 110 and an operation unit 504. Display on the display unit 110 is performed under the control of the control unit 510. The display unit 110 displays information necessary for an incoming or outgoing call, information about an email such as a destination address and a message, an image obtained through an Internet connection, an image picked up by a camera unit 522, information obtained through execution of a variety of functions which the terminal device 100 has, and so forth. The operation unit 504 includes operation keys disposed in the terminal device 100 and the touch panel disposed in the display unit 110. The operation unit 504 supplies instructions issued by operations performed by the user to the control unit 510. When the control unit 510 is supplied with data generated by detection of a touch operation in the touch panel, the control unit 510 determines what position is touched in an image displayed on the display unit 110 and performs a process in accordance with the touch operation.

The control unit 510 includes a microprocessor and performs communication control, voice processing and control of voice processing, image processing and control of image processing, and so forth. The control unit 510 is connected to a memory 505 through the control line 530 and the data line 540. The control unit 510 reads data and programs stored in the memory 505.

The terminal device 100 includes the camera unit 522. The camera unit 522 picks up images under the control of an image pickup control unit 521. Still image data or moving image data obtained through an image pickup operation using the camera unit 522 is stored in the memory 505.

The terminal device 100 also includes a vibrator drive unit 508. The vibrator drive unit 508 supplies a drive signal to a vibrator 182, which is disposed in the second housing 102, in accordance with an instruction from the control unit 510. When the drive signal is supplied to the vibrator 182, the vibrator 182 starts up and vibrates the terminal device 100.

The terminal device 100 includes an illumination drive unit 509. The illumination drive unit 509 drives three light emitting diodes 161*a*, 161*b*, and 161*c*, which illuminate transparent member 120, in accordance with an instruction form the control unit 510. States of illumination using the light emitting diodes 161*a*, 161*b*, and 161*c* will be described later.

[3. Structure for Connecting First Housing to Second Housing]

Next, a structure that connects the first housing 101 to the second housing 102 using the transparent member 120 will be described with reference to FIGS. 3 to 6.

Figure 3:
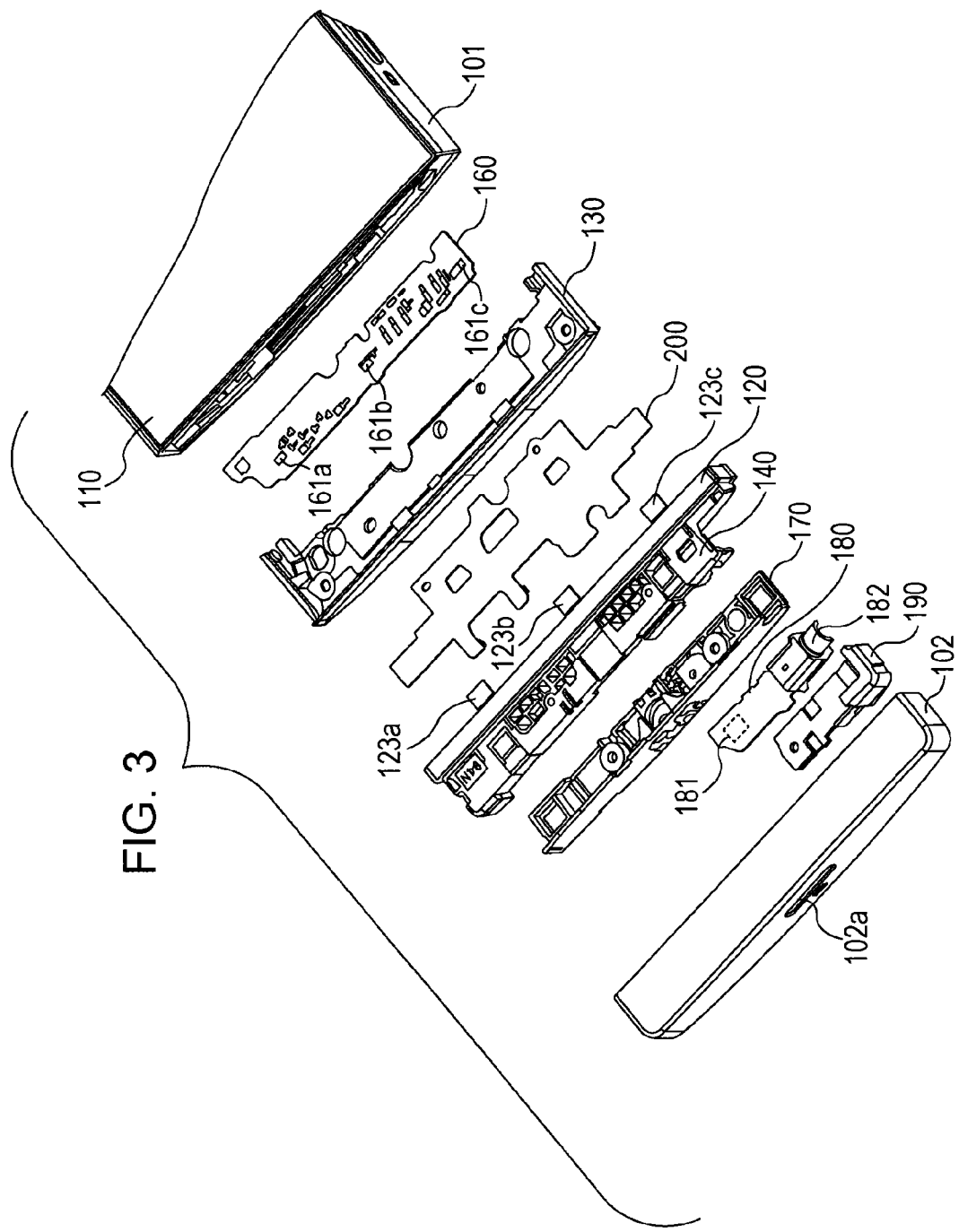
FIG. 3 is an exploded perspective view illustrating part of the example terminal device illustrated in FIG. 1.

FIG. 3 is an exploded view illustrating members disposed near the transparent member 120 inside the first housing 101 and the second housing 102.

As illustrated in FIG. 3, a supporting member 130 is mounted on an upper side of the transparent member 120 and a supporting member 140 is mounted on a lower side of the transparent member 120. The supporting member 130 and the supporting member 140 are formed by molding white resin or other opaque resin. Although the supporting member 130 is separated from the transparent member 120 in FIG. 3, the transparent member 120 and the supporting members 130 and 140 are integrally formed by molding.

The upper supporting member 130 is housed in the first housing 101, and the lower supporting member 140 is housed in the second housing 102. Each of the transparent member 120 and the supporting members 130 and 140 illustrated in FIG. 3 is formed by bonding a front member and a rear member to each other.

A transparent flexible substrate 200, on which transparent electrodes and so forth are formed, is surrounded by the transparent member 120. The details of a structure in which the transparent flexible substrate 200 is surrounded will be described later.

A circuit substrate 160 is mounted on the supporting member 130, which is disposed on the upper side of the transparent member 120. A circuit substrate 180 and the antenna member 170 are mounted on the supporting member 140, which is disposed on the lower side of the transparent member 120. The microphone 181 and the vibrator 182 are mounted on the circuit substrate 180.

The circuit substrate 160 disposed above the transparent member 120 are electrically connected to the antenna 170 and the circuit substrate 180 disposed below the transparent member 120 through a wiring pattern on the transparent flexible substrate 200. The details of the state of the electrical connection will be described later.

The transparent member 120 has three transparent extended portions 123a, 123b, and 123c that protrude upward. The circuit substrate 160 to be mounted on the supporting member 130 includes the three light emitting diodes 161a, 161b, and 161c, which are respectively disposed at positions so as to be adjacent to the transparent extended portions 123a, 123b, and 123c in an assembled state.

Figure 4:
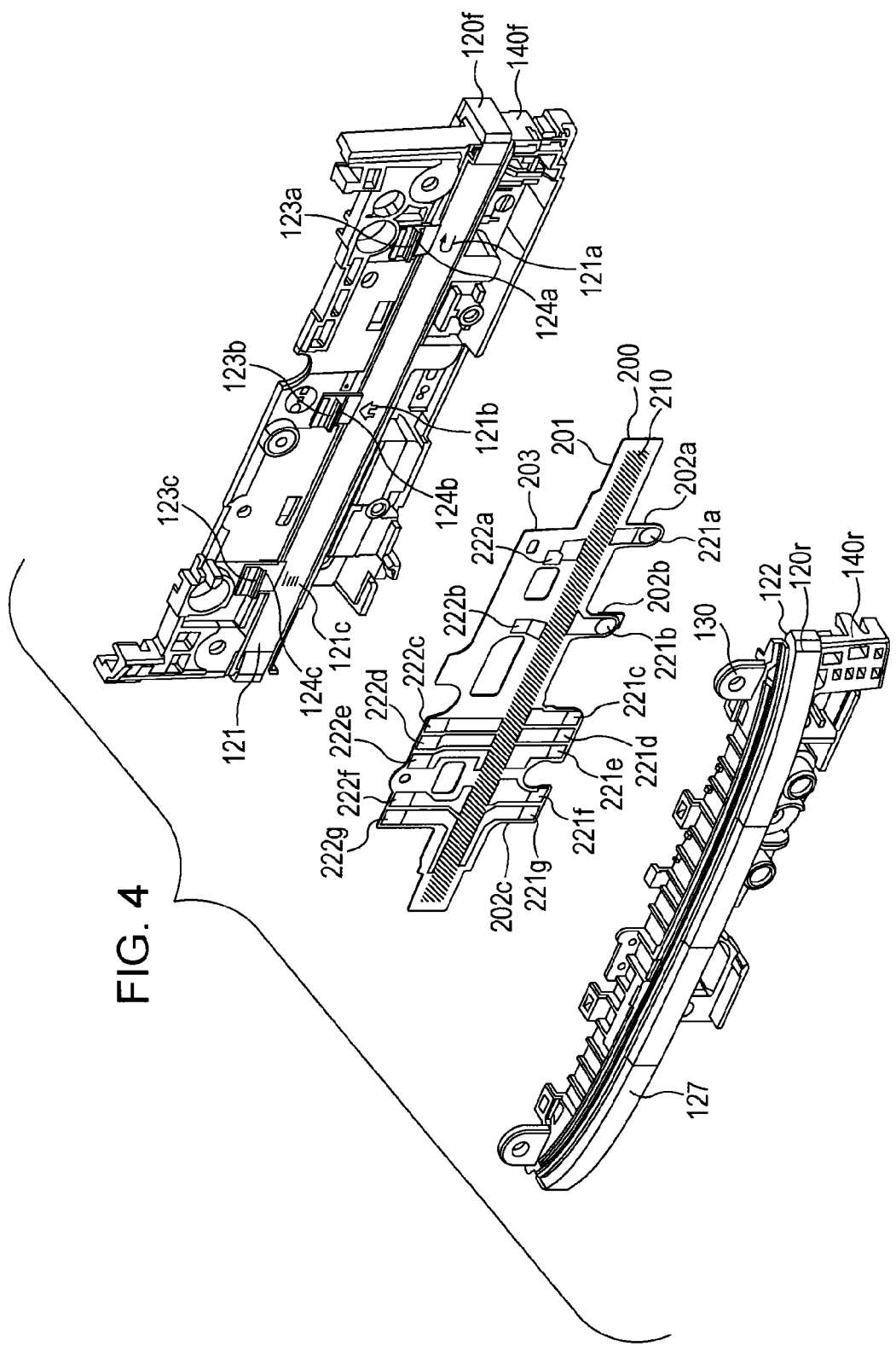
FIG. 4 is an exploded perspective view illustrating members included in the example terminal device illustrated in FIG. 1.

FIG. 4 illustrates the details of the structure in which the transparent member 120 surrounds the transparent flexible substrate 200. As illustrated in FIG. 4, the transparent member 120 is formed by bonding a front transparent member 120f and a rear transparent member 120r to each other. In FIG. 4, the front side of FIG. 4 is a rear surface of the terminal device 100 and the rear side of FIG. 4 is a front surface of the terminal device 100. A rear surface 127 (a surface on the front side in FIG. 4) of the rear transparent member 120r is a curved surface along the shapes of rear surfaces of the first housing 101 and the second housing 102.

The front transparent member 120f and the rear transparent member 120r are formed by molding, for example, transparent acryl resin.

A front supporting member 130f is integrally molded with the front transparent member 120f on the upper side of the front transparent member 120f. A front supporting member 140f is integrally molded with the front transparent member 120f on the lower side of the front transparent member 120f. A rear supporting member 130r is integrally molded with the rear transparent member 120r on the upper side of the rear transparent member 120r. A rear supporting member 140r is integrally molded with the rear transparent member 120r on the lower side of the rear transparent member 120r. The front supporting members 130f and 140f, which are integrally molded with the front transparent member 120f on the upper and lower sides of the front transparent member 120f, respectively, and the rear supporting members 130r and 140r, which are integrally molded with the rear transparent member 120r on the upper and lower sides of the rear transparent member 120r, respectively, are formed by molding colored resin such as white resin. In the description below, it is assumed that the front supporting members 130f and 140f and the rear supporting members 130r and 140r are colored white.

The transparent members 120f and 120r and the white supporting members 130f, 130r, 140f, and 140r are integrally molded by, for example, two-color molding (double mode). That is, in order to mold resin, white resin is initially charged into the mold so as to mold the supporting members 130f, 130r, 140f, and 140r. After that, transparent resin is charged into the mold so as to mold the transparent members 120f and 120r which are transparent while the components formed by molding the white resin are still left in the mold. Although the transparent members are initially molded, it is only an example and the white supporting members may be initially molded.

The three transparent extended portions 123a, 123b, and 123c, which have been described with reference to FIG. 3, are integrally formed of the transparent resin with the front transparent member 120f on the upper side of the front transparent member 120f near a mating surface 121 of the front transparent member 120f. The transparent extended portions 123a, 123b, and 123c each have a corresponding one of transparent protrusions 124a, 124b, and 124c formed in the middle of each of the transparent extended portions 123a, 123b, and 123c. The transparent extended portions 123a, 123b, and 123c are thin components and would be easily damaged as individual components. However, since the transparent extended portions 123a, 123b, and 123c are integrally molded with the front supporting member 130f, the front supporting member 130f supports the transparent extended portions 123a, 123b, and 123c, thereby maintaining the strength of the transparent extended portions 123a, 123b, and 123c.

As illustrated in FIG. 4, three printed patterns 121a, 121b, and 121c are formed on the mating surface 121 of the front transparent member 120f. Each of the printed patterns 121a, 121b, and 121c simply graphically indicates an operation key formed at a position where each of the printed patterns 121a, 121b, and 121c is printed. For example, the printed pattern 121a indicates a graphic of a back key, the printed pattern 121b indicates a graphic of a home key, and the printed pattern 121c indicates a graphic of a menu key. These printed patterns 121a to 121c are printed in colors that appear nearly transparent, and become clearly visible when illumination, which will be described later, is performed.

When the mating surface 121 of the transparent member 120f and a mating surface 122 of the transparent member 120r are bonded to each other, the transparent flexible substrate 200 is interposed therebetween and transparent adhesive 401 (FIG. 6) is applied. Although the adhesive 401 is used for bonding, it is only an example and adhesive tape may be used for bonding. Alternatively, the adhesive 401 may be used together with the adhesive tape.

The transparent flexible substrate 200 is formed of a resin material having high transparency such as PET (Polyethylene terephthalate). The transparent flexible substrate 200 has a belt portion 201, lower protrusions 202a, 202b, and 202c, and an upper protrusion 203. The belt portion 201 is interposed between the front transparent member 120f and the rear transparent member 120r. The lower protrusions 202a, 202b, and 202c protrude downward from the belt portion 201. The upper protrusion 203 protrudes upward from the belt portion 201.

A transparent electrode pattern 210 is disposed on the belt portion 201. Pads 221a to 221g and 222a to 222g, which are connected to the transparent electrode pattern 210, are disposed in the protrusions 202a, 202b, 202c, and 203. The details of the structure including an electrode pattern provided on the transparent flexible substrate 200 will be described later.

Figure 5:
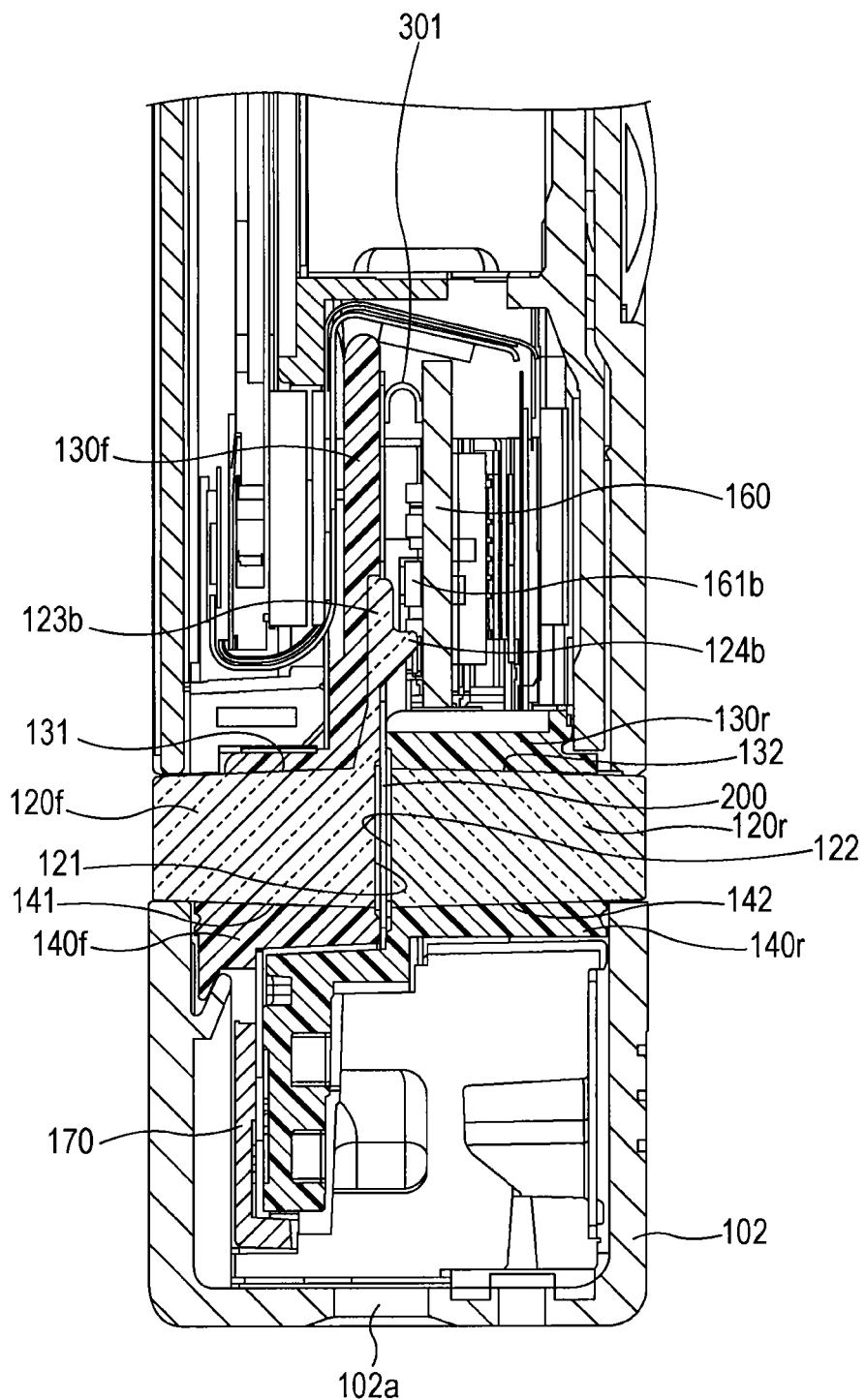
FIG. 5 is a sectional view of part of the example terminal device illustrated in FIG. 1 taken along line V-V in FIG. 1.

FIG. 5 is a sectional view of a state in which components are arranged in the terminal device 100. As illustrated cutting plane line V-V in FIG. 1, FIG. 5 illustrates a vertical section taken at substantially the center of the terminal device 100.

As illustrated in FIG. 5, the transparent flexible substrate 200 is interposed between the front transparent member 120f and the rear transparent member 120r. The transparent extended portion 123b of the front transparent member 120f extends upward along the supporting member 130f. The transparent protrusion 124b formed in the middle of the transparent extended portion 123b is disposed near the light emitting diode 161b mounted on the circuit substrate 160. Thus, when the light emitting diode 161b emits light, the light strikes the transparent extended portion 123b. The light is introduced by the transparent extended portion 123b and illuminates an area near the mating surface 121 of the front transparent member 120f. Here, as illustrated in FIG. 4, the printed pattern 121b (see FIG. 4) is formed on the mating surface 121. The printed pattern 121b becomes clearly visible by light emitted from the light emitting diode 161b. The other printed patterns 121a and 121c also become clearly visible by light emitted from the light emitting diodes 161a and 161c.

As can be seen from the sectional view in FIG. 5, the front transparent member 120f contacts an edge 131 of the white front supporting member 130f at an upper end portion thereof and an edge 141 of the white front supporting member 140f at a lower end portion thereof. The rear transparent member 120r contacts an edge 132 of the white rear supporting member 130r at an upper end portion thereof and an edge 142 of the white rear supporting member 140r at a lower end portion thereof. By doing this, when the light emitting diodes 161a to 161c emit light, the light is supplied to the front and rear surfaces without leaking through an area above or below the transparent member 120f or 120r. Thus, the transparent members 120f and 120r are efficiently illuminated by the emitted light.

Figure 6:
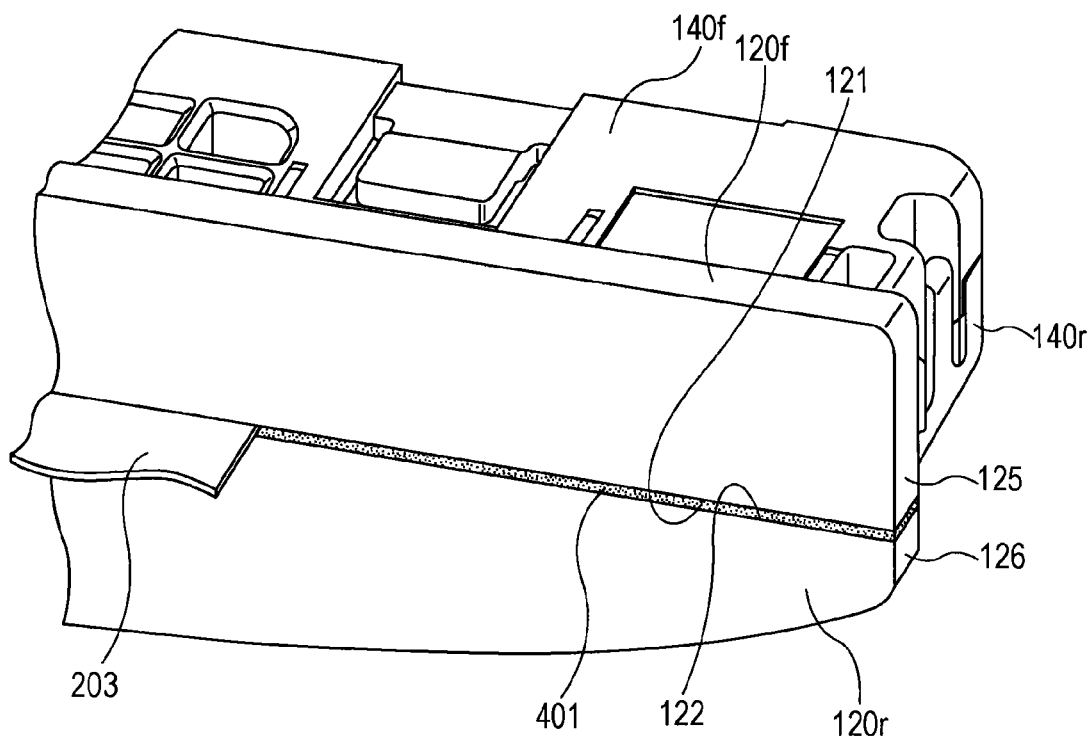
FIG. 6 is a perspective view illustrating members included in the example terminal device illustrated in FIG. 1.

FIG. 6 illustrates a state in which the front transparent member 120f and the rear transparent member 120r are mated with each other. The front supporting member 130f and the rear supporting member 130r are removed in FIG. 6. The mating surface 121 of the front transparent member 120f and the mating surface 122 of the rear transparent member 120r are bonded to each other with the transparent adhesive 401 applied into the gap therebetween. The transparent flexible substrate 200 is disposed between both of the mating surfaces 121 and 122. In the state illustrated in FIG. 6, the belt portion 201 of the transparent flexible substrate 200 is interposed and hidden between the mating surfaces 121 and 122 while the upper protrusion 203 extends upward from the mating surfaces 121 and 122.

In order to bond the front transparent member 120f and the rear transparent member 120r to each other, an end surface 125 of the front transparent member 120f and an end surface 126 of the rear transparent member 120r are polished. When the transparent members 120f and 120r are formed by molding resin, gates for injecting resin are formed on the end surfaces 125 and 126. This polishing process is performed in order to remove the gates, and accordingly, to align both the end surfaces 125 and 126 with each other on a single plane.

[4. Connection Structure Using Transparent Flexible Substrate]

Next, a structure that connects circuitry in the first housing 101 to circuitry in the second housing 102 using the transparent flexible substrate 200 will be described with reference to FIGS. 7 to 10.

Figure 7:
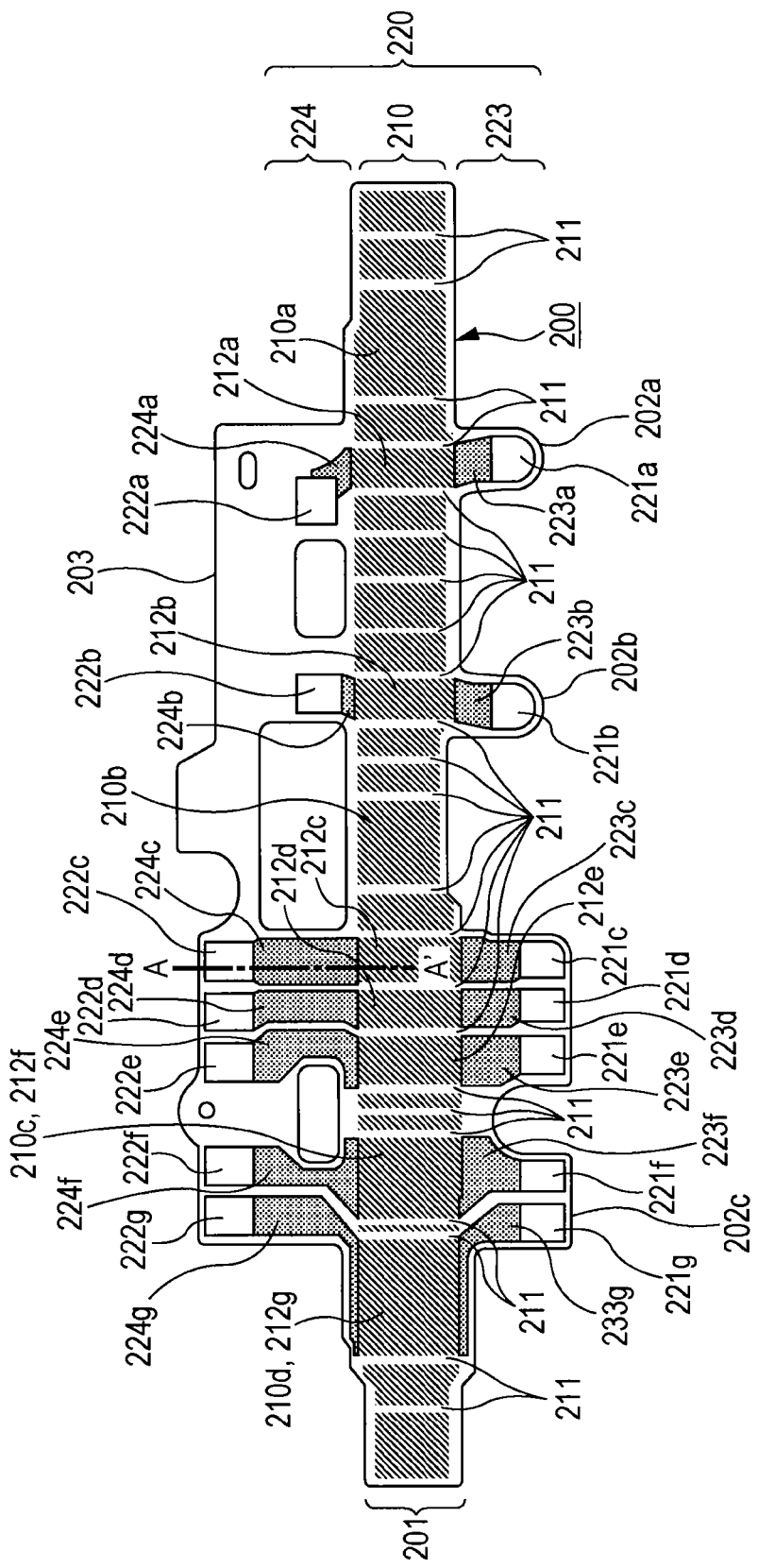
FIG. 7 is a plan view illustrating an example of a transparent substrate disposed in the example terminal device illustrated in FIG. 1.

FIG. 7 illustrates an example arrangement of electrodes on the transparent flexible substrate 200. The transparent flexible substrate 200, which is formed of a transparent resin material such as PET, has the belt portion 201 interposed between the front transparent member 120f and the rear transparent member 120r as described above. The transparent electrode pattern 210, which is a transmissive region, is arranged in the belt portion 201. The transparent electrode pattern 210 is formed of electrodes having very small widths, the electrodes being arranged so as to have a mesh-like shape. This makes most of the transparent electrode pattern 210 transmissive, thereby realizing an electrode pattern having a substantially transparent appearance. The electrodes arranged in the mesh-like shape are equally spaced apart from one another. Thus, the mesh-like transparent electrode pattern 210 is not completely transparent. The transparent electrode pattern 210 becomes weakly visible when the transparent electrode pattern 210 is illuminated by comparatively bright light.

Next, the structure of the transparent flexible substrate 200 illustrated in FIG. 7 will be described.

As illustrated in FIG. 7, a conductive region 220 is arranged in the transparent flexible substrate 200. The conductive region 220 includes a transmissive region (transparent electrode pattern) 210 and non-transmissive regions (non-transparent electrodes) 223 and 224.

The mesh-like transparent electrode pattern 210, which is the transmissive region, is divided into a plurality of electrodes by a plurality of vertically (in the vertical direction of the terminal device 100) extending pattern gap portions 211. Some of the plurality of electrodes are utilized as wiring line portions 212a to 212g. The pattern gap portions 211 are also formed at positions that are not utilized as the wiring line portions 212a to 212g.

When the transparent electrode pattern 210 is cut by the pattern gap portions 211, four wide width portions 210a, 210b, 210c, and 210d are formed. Out of the four wide width portions 210a to 210d, three wide width portions 210a, 210b, and 210d are bonded to positions on which the printed patterns 121a, 121b, and 121c are printed on the mating surface 121 (FIG. 4) of the front transparent member 120f.

The wiring line portions 212a to 212g of the transparent electrode pattern 210, through which electricity flows, are electrically connected to non-transparent electrodes 223a to 223g and 224a to 224g formed in the non-transmissive regions 223 and 224. The non-transparent electrodes 223a to 223g and 224a to 224g of the non-transmissive regions 223 and 224 are formed by a typical electrically conductive material such as copper arranged on the transparent flexible substrate 200. Electrically conductive portions of the non-transparent electrodes 223a to 223g and 224a to 224g have the pads 221a to 221g and 222a to 222g, which have exposed electrodes. The pads 221a to 221g and 222a to 222g are plated with, for example, gold.

A specific connection states of the wiring line portions are described as follows. That is, for example, the wiring line portion 212a of the transparent electrode pattern 210 is connected to the non-transparent electrode 223a in the lower portion of the transparent flexible substrate 200 and connected to the non-transparent electrode 224a in the upper portion of the transparent flexible substrate 200. The lower non-transparent electrode 223a has the pad 221a and the upper non-transparent electrode 224a has the pad 222a.

The wiring line portion 212b of the transparent electrode pattern 210 is connected to the non-transparent electrode 223b in the lower portion of the transparent flexible substrate 200 and connected to the non-transparent electrode 224b in the upper portion of the transparent flexible substrate 200. The lower non-transparent electrode 223b has the pad 221b and the upper non-transparent electrode 224b has the pad 222b.

These two wiring line portions 212a and 212b are used as wiring for the antenna incorporated in the antenna member 170. The antenna member 170 in the second housing 102 is connected to the communication processing unit 502 (FIG. 2) in the first housing 101 through the transparent wiring line portions 212a and 212b.

The three wiring line portions 212c, 212d, and 212e, which are arranged side by side, are respectively connected to the non-transparent electrodes 223c, 223d, and 223e in the lower portion of the transparent flexible substrate 200 and respectively connected to the non-transparent electrodes 224c, 224d, and 224e in the upper portion of the transparent flexible substrate 200. The lower non-transparent electrodes 223c, 223d, and 223e respectively have the pads 221c, 221d, and 221e, and the upper non-transparent electrodes 224c, 224d, and 224e respectively have the pads 222c, 222d, and 222e.

These three wiring line portions 212c, 212d, and 212e are used as wiring for microphone 181. The voice signal obtained using the microphone 181 in the second housing 102 is supplied to a voice processing circuit (not shown) in the first housing 101.

The wiring line portions 212f and 212g are respectively connected to the non-transparent electrodes 223f and 223g in the lower portion of the transparent flexible substrate 200 and respectively connected to the non-transparent electrodes 224f and 224g in the upper portion of the transparent flexible substrate 200. The lower non-transparent electrodes 223f and 223g respectively have the pads 221f and 221g, and the upper non-transparent electrodes 224f and 224g have the pads 222f and 222g.

These two wiring lines 212f and 212g are used as wiring that supplies the drive signal to the vibrator 182. Part of the transparent electrode pattern 210 not used as wiring is disposed between the two wiring lines 212f and 212g. The wiring lines 212f and 212g are formed using the wide width portions 210c and 210d of the transparent electrode pattern 210. The vibrator 182 is a component that vibrates the terminal device 100 with a vibrating element being vibrated by rotation or the like of a motor. Accordingly, a comparatively large current needs to flow in order to drive the vibrator 182. With the transparent wiring lines 212f and 212g using the wide width portions 210c and 210d, a required level of the current can be supplied to the vibrator 182.

Next, the sectional structure of the transparent flexible substrate 200 will be described with reference to FIG. 8.

Figure 8:
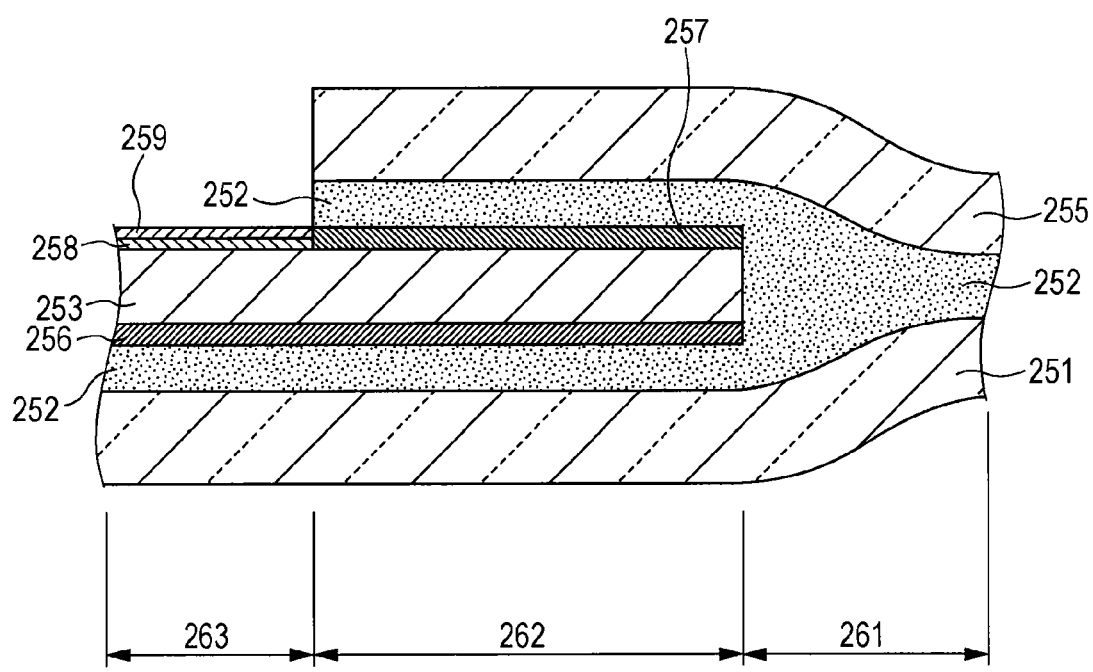
FIG. 8 is a sectional view of the example transparent substrate illustrated in FIG. 7.

FIG. 8 illustrates the section of a non-conductive region 261, of which the transparent electrode pattern 210 other than the wiring line portions 212, the pattern gap portions 211, and the like are formed, a conductive region 262, of which the wiring line portions 212 and the non-transmissive regions 223 and 224 are formed, and a pad region 263 in which the pads are disposed. The electrode of each pad is exposed.

The structure of the non-conductive region 261 is initially described. The non-conductive region 261 of the transparent flexible substrate 200 has a structure in which a cover material 255 is stacked on a base material 251 formed of transparent resin (PET or the like) with a transparent bonding layer 252 therebetween. The cover material 255 is also formed of transparent resin such as PET. This region is a transparent region, in which a copper foil 253 used for the conductive region 262 and the pad region 263 are not present.

The conductive region 262 of the transparent flexible substrate 200 is formed as follows. That is, the mesh-like copper foil 253 is stacked on the base material 251 with the transparent bonding layer 252 therebetween. Copper oxide films 256 and 257 are formed on upper and lower sides of the copper foil 253. Furthermore, the cover material 255 is stacked on them with the transparent bonding layer 252 therebetween. The conductive region 262 decreases light reflected by copper due to the black-colored copper oxide films 256 and 257, thereby making the wiring line portions 212a to 212g formed of the copper foil 253 difficult to be visually recognized from an external area. Surfaces of the copper oxide films 256 and 257 may be roughened to irregularly reflect light, thereby making the wiring line portions 212a to 212g be more difficult to be visually recognized from an external area.

The pad region 263 of the transparent flexible substrate 200 is formed as follows. That is, the copper foil 253 is stacked on the base material 251 with the copper oxide film 256 and the transparent bonding layer 252 therebetween. A nickel-plated layer 258 and a gold-plated layer 259 are stacked on the copper foil 253. The gold-plated layer 259 is exposed in the surface.

As can be seen from the section illustrated in FIG. 8, the non-conductive region 261, the conductive region 262, and the pad region 263 are formed on the single transparent flexible substrate 200 in a continuous manner using the copper foil 253 and other common materials. That is, when seen in a section, for example, along line A-A' in FIG. 7, the non-transparent electrode 224, which is formed of the conductive region 262, is disposed adjacent to the pad, which is formed of the pad region 263. The wiring line portion 212c, which is formed of the conductive region 262, is disposed adjacent to the non-transparent electrode 224. The transparent electrode pattern 210 other than the wiring line portion 212, the transparent electrode pattern 210 being formed of the non-conductive region 261, is disposed adjacent to the wiring line portion 212c. In this manner, the wiring line portion 212c, which is formed of the conductive region 262, and the transparent electrode pattern 210 other than the wiring line 212, the transparent electrode pattern 210 being formed of the non-conductive region 261, are repeatedly disposed in accordance with the number of the mesh cells.

Figure 9:
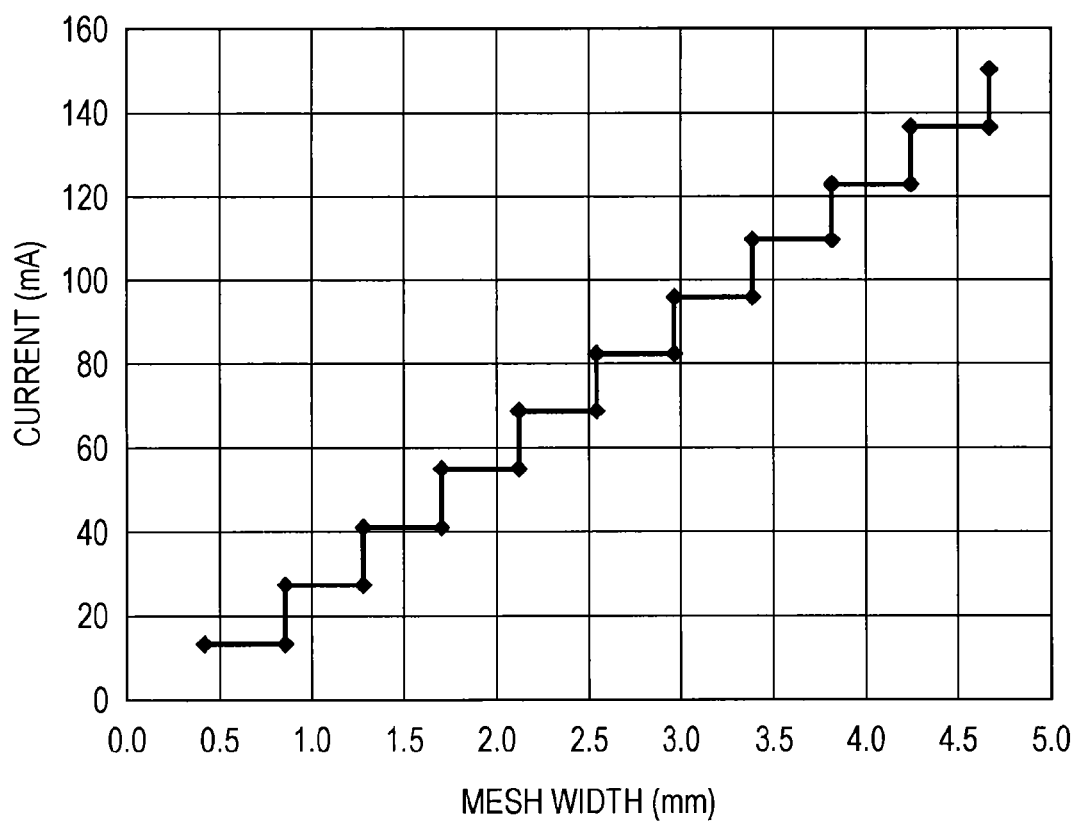
FIG. 9 is a characteristic chart of the transparent substrate.

FIG. 9 illustrates the relationship between the width of the wiring line portion of the transparent electrode pattern 210 formed of the mesh-like electrode in the transparent flexible substrate 200 and the current allowed to flow in the mesh-like wiring line portion. As illustrated in FIG. 9, as the width increases, the current value allowed to flow increases. In FIG. 9, the characteristic is represented in a stepwise manner because of the mesh-like shape of the wiring line portion. That is, as the number of cells of the mesh increases one by one, the current increases.

As can be seen from FIG. 9, use of the wide width portions 210c and 210d as the wiring line portions can ensure that the transparent wiring line portion has the level of electric capacity that allows a comparatively large current for driving the vibrator 182 to flow.

Figure 10:
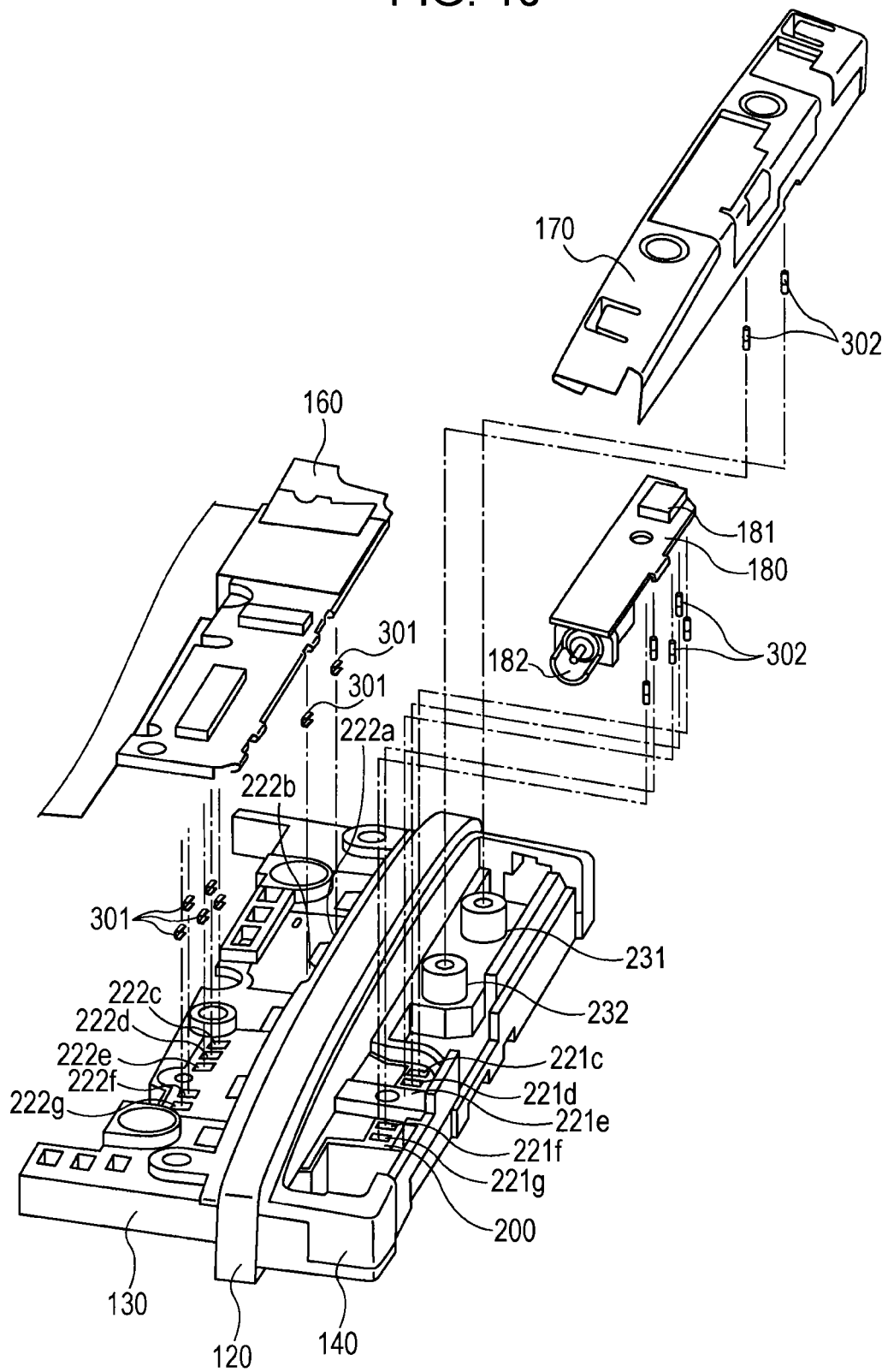
FIG. 10 is an exploded perspective view illustrating members included in the example terminal device illustrated in FIG. 1.

FIG. 10 is an exploded view illustrating circuit substrates and members connected to the pads 221a to 221g, and 222a to 222g of the transparent flexible substrate 200 surrounded by the transparent member 120. As illustrated in FIG. 10, the supporting member 130 is integrally molded on the upper side (left in FIG. 10) of the transparent member 120, and the supporting member 140 is integrally molded on the lower side of (right in FIG. 10) the transparent member 120. As described before, in an assembled state, the supporting member 130 is housed in the first housing 101 illustrated in FIG. 1, the supporting member 140 is housed in the second housing 102 illustrated in FIG. 1, and the transparent member 120 connects the two housings 101 and 102 to each other.

The transparent flexible substrate 200 illustrated in FIG. 7 is interposed between the front transparent member 120f and the rear transparent member 120r, which are part of the transparent member 120. The pads 221a to 221g and 222a to 222g are exposed from the supporting members 130 and 140. In FIG. 10, the pads 221a and 221b are hidden by pin holders 231 and 232 provided on the supporting member 140.

The pads 221a and 221b in the pin holders 231 and 232 of the supporting member 140 are connected to feeding points of the antenna member 170 through pins 302. The pads 221c, 221d, and 221e are connected to the microphone 181 on the circuit substrate 180 through the pins 302. The pads 221f and 221g are connected to the vibrator 182 on the circuit substrate 180 through the pins 302.

The pins 302 are electrically conductive components having a spring therein. The pins 302 connect the pads 221a to 221g to components in an electrically stable manner.

The pads 222a to 222g, which are disposed on the supporting member 130 side, are connected to the conductive portions (not shown) of the circuit substrate 160 through plate springs 301. With the plate springs 301 being provided, the pads 222a to 222g are electrically stably connected to the circuit substrate 160.

As described above, the transparent wiring line portions 212a to 212g, which are disposed on the transparent flexible substrate 200 illustrated in FIG. 7, are used to electrically connect the circuit substrate 160 disposed in the first housing 101 to the antenna member 170, the microphone 181, and the vibrator 182 disposed in the second housing 102 as illustrated in FIG. 10.

Accordingly, as illustrated in FIG. 1, the circuitry in the first housing 101 connected through the transparent member 120 is electrically connected to electronic components in the second housing 102. Specifically, in the terminal device 100, radio signals are transmitted and received using the antenna member 170 in the second housing 102, and the antenna is disposed at a preferable lower end position. Also in the terminal device 100, the microphone 181 is disposed in the second housing 102 at the lower end of the terminal device 100. Thus, the microphone 181 can be disposed at a preferable lower end position. Furthermore, the vibrator 182 can be disposed at the lower end of the terminal device 100, which is a position suitable for vibrating the terminal device 100.

The amount of current allowed to flow in the transparent electrode pattern is small compared to a conductive portion formed typically of copper wires or the like. However, as illustrated in FIG. 7, the wide width portions 210c and 210d are used for the transparent wiring lines 212f and 212g that supply a comparative high current drive signal to the vibrator 182, thereby allowing a comparatively high current to flow.

In addition, as illustrated in FIG. 7, the transparent wiring lines 212a and 212b for connecting the antenna member 170 are disposed at positions so as to be comparatively spaced apart from the other wiring lines 212c to 212g, and a number of the pattern gap portions 211 are formed. Thus, preferable antenna characteristics can be ensured. That is, the transparent electrode pattern 210 is finely divided by a number of the pattern gap portions 211 with a degree of distances. By doing this, the transparent electrodes of the transparent electrode pattern 210 do not have a large electrical capacitance that can affect the antenna characteristics. Thus, unnecessary capacitors are not arranged near connection paths of the antenna, thereby realizing preferable antenna characteristics.

The arrangement state and the number of the pattern gap portions 211 illustrated in FIG. 7 are only an example. Preferably, electrical capacitance of each transparent electrode, the electrical capacitance being determined by the arrangement state and the number of the pattern gap portions 211, is suitably selected in accordance with a frequency band transmitted and received by the antenna member 170.

In the transparent flexible substrate 200, the non-transparent wiring lines are formed so as to be continuous with the mesh-like transparent electrode pattern, and pads are provided on the non-transparent wiring lines. Thus, the transparent flexible substrate 200 can be electrically connected to external circuitry in a preferable manner. That is, since the mesh-like transparent electrode pattern is a pattern including fine wiring lines, the mesh-like transparent electrode pattern is not easily directly connected to the external circuitry in a stable manner. However, as illustrated in FIGS. 7 and 8, the non-conductive region 261, the conductive region 262, and the pad region 263 are formed, thereby allowing preferable electrical connection to be realized using the pads of the pad region 263.

[5. Illumination State of Transparent Portion]

Figure 11:
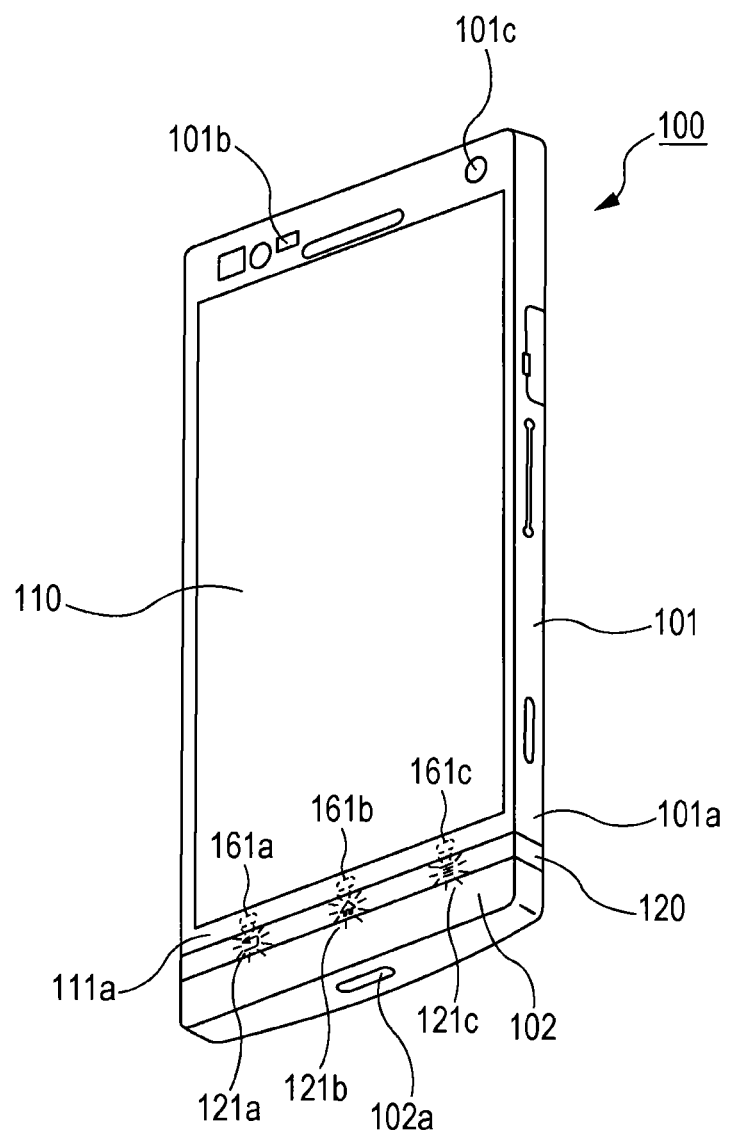
FIG. 11 is a perspective view illustrating a state in which part of the example terminal device illustrated in FIG. 1 is illuminated.

Next, a state in which the light emitting diodes 161a, 161b, and 161c are turned on will be described with reference to FIG. 11. The light emitting diodes 161a, 161b, and 161c are disposed near the transparent member 120 of the terminal device 100.

The display unit 110 substantially entirely covers a surface of the first housing 101. The touch panel provided in the display unit 110 has a sensitivity that detects a touch made at positions down to the lower portion 101a of the first housing. As illustrated in FIG. 11, the three light emitting diodes 161a, 161b, and 161c are disposed in the lower portion 101a of the first housing 101. Here, assume that the user holding the terminal device 100 touches a position near positions where the light emitting diodes 161a, 161b, and 161c are disposed on the surface of the housing 101.

At this time, the touch panel provided in the display unit 110 detects the touching operation and operates in accordance with the touching operation. With the touching operation, the light emitting diode 161a, 161b, or 161c near a position where the touching operation is detected emits light. When the light emitting diode 161a, 161b, and 161c are turned on, the mating surface 121 of the transparent member 120 is illuminated and the corresponding printed patterns 121a, 121b, and 121c (FIG. 4) formed at the illuminated positions become clearly visible.

The three light emitting diodes 161a, 161b, and 161c may separately emit light in accordance with a touch detected at positions where the light emitting diode 161a, 161b and 161c are disposed. Alternatively, the three light emitting diodes 161a, 161b, and 161c may simultaneously emit light when a touch is detected at a position where any one of the light emitting diode 161a, 161b and 161c is disposed. Alternatively, the light emitting diodes 161a, 161b, and 161c may emit light in accordance with an operating mode of the terminal device 100 independently of detection of a touch.

As described above, in the terminal device 100, the position where the transparent member 120 is disposed functions as touch keys with illumination. In addition, the functions assigned to the keys are indicated by the printed patterns 121a, 121b, and 121c. Thus, with the transparent member 120 being provided, a well-designed terminal device featuring good operability is obtained.

The positions where the printed patterns 121a, 121b, and 121c are formed are the wide width portions 210c, 210b, and 210d of the transparent electrode pattern 210 of the transparent flexible substrate 200 as illustrated in FIG. 7. Thus, the pattern gap portions 211 are not formed at positions where the printed patterns 121a, 121b, and 121c are illuminated. This prevents a situation in which unnecessary linearly shaped portions become visible because of illumination at positions where the pattern gap portions 211 are formed.

Figure 12:
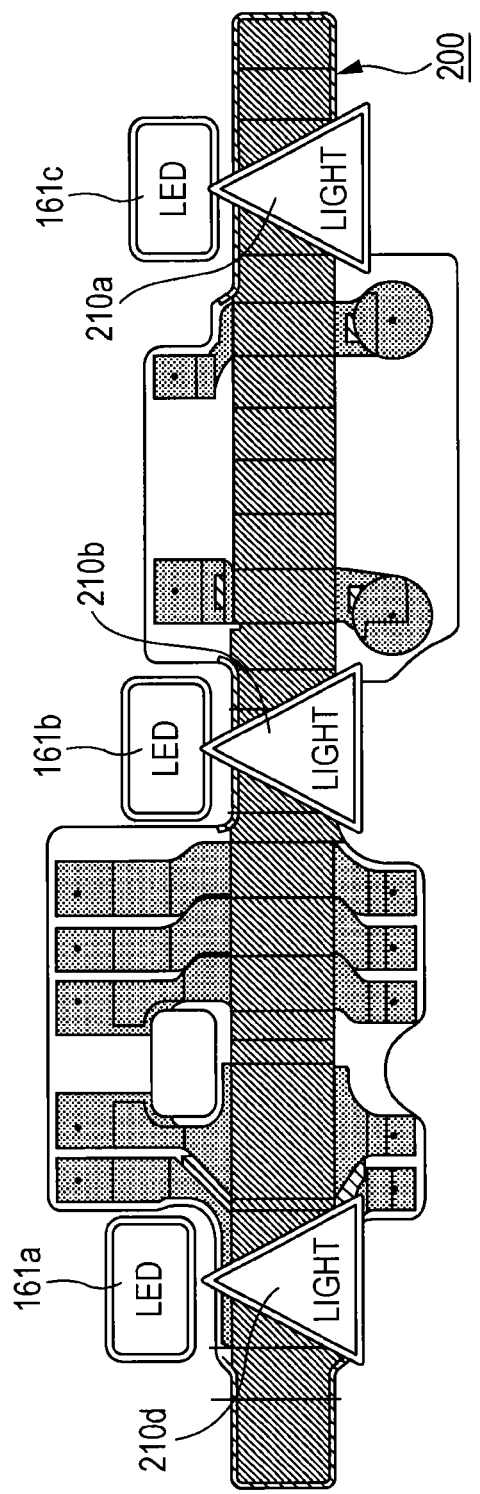
FIG. 12 illustrates a state in which the transparent substrate is illuminated.

FIG. 12 illustrates the relationship between the positions illuminated by the three light emitting diodes 161a, 161b, and 161c and the arrangement state of the wide width portions 210a, 210b and 210d of the transparent electrode pattern 210 of the transparent flexible substrate 200. As illustrated in FIG. 12, the wide width portions 210a, 210b and 210d are illuminated and the pattern gap portions 211 are not illuminated by intense light. Thus, unnecessary lines are not visible at the illuminated positions.

As can be seen from the section illustrated in FIG. 5, the transparent member 120 contacts the edges 131 and 132 of the white supporting member 130 at the upper portion thereof and the edges 141 and 142 of the white supporting member 140 at the lower end portion thereof. By doing this, light introduced from the light emitting diodes 161a, 161b, and 161c into the transparent member 120 is efficiently supplied to the front and rear surfaces without leaking through an area above or below the transparent member 120. Thus, preferable illumination can be realized.

In addition, as illustrated in the section in FIG. 8, the copper oxide films 256 and 257 are formed on the copper foil 253 of the conductive region in the transparent flexible substrate 200. Thus, light reflection at the surfaces of the conductive portions can be suppressed, thereby allowing leakage of light through the transparent part 120 to be suppressed.

[6. Modifications]

In the above-described embodiment, an example of the terminal device applied to a mobile phone terminal device, which is a so-called smart phone, has been described. Alternatively, a similar structure may be applied to a variety of other terminal devices. For example, a housing of a portable audio player device may include a first housing and second housing. In this case, the first and second housings are connected to each other using a transparent member, and a transparent member holding mechanism of the present disclosure is applied to the portable audio player device.

In the above-described embodiment, an example is described, in which the antenna, the microphone, and the vibrator are disposed in the second housing 102 and connected to the circuitry in the first housing 101 through the transparent electrodes. Alternatively, other electronic components may be disposed in the second housing 102. In this case, the electronic components disposed are connected to the circuitry in the first housing 101 through the transparent electrode pattern of the transparent flexible substrate 200.

In the above-described embodiment, the touch panel on the first housing 101 side is used as a touch detection sensor in order to make an area near the transparent member 120 function as touch keys. Alternatively, a touch detection sensor may be disposed, for example, in the second housing 102. In this case, the transparent member 120 is illuminated when a touch made on the surface of the second housing 102 is detected. In this case, the touch detection sensor in the second housing 102 may be connected to the circuitry in the first housing 101 through the transparent electrode pattern of the transparent flexible substrate 200.

In the above-described embodiment, as illustrated in FIG. 7, the mesh-like transparent electrode pattern 210 is disposed on the transparent flexible substrate 200. Alternatively, for example, as the transparent flexible substrate 200, the conductive portion on the first housing 101 side and the conductive portion on the second housing 102 side may be connected by a transparent electrode portion formed of one or plurality of linearly shaped lines. As the transparent electrode pattern 210, a conductive material such as copper are arranged so as to form a thin mesh-like shape, thereby allowing the transparent electrode pattern 210 to appear substantially transparent. Alternatively, for example, the transparent electrode pattern may use a transparent conductive material such as ITO (indium tin oxide).

Structures and processes described in the claims of the present disclosure are not limited to an example of the above-described embodiment. Those skilled in the art should appreciate that a variety of changes, combinations, and other examples of the embodiment may be possible depending on the design or other elements within the scope of the claims or the scope equivalent to the claims.

According to the disclosure outlined above, the present disclosure may include (1) an information processing apparatus comprising: a first housing;

a second housing; a transparent member disposed between the first and second housings; and a transparent substrate including a transmissive electrode area having a wiring line portion electrically connecting an interior of the first housing and an interior of the second housing, the wiring line portion having a width set based on a current flow through the wire line portion.

(2) The information processing apparatus of (1), wherein the wiring line portion is formed of a mesh-like electrode.

(3) The information processing apparatus of (2), wherein the mesh-like electrode includes a plurality of portions each having widths determined in accordance with an amount of current to flow in each of the plurality of portions.

(4) The information processing apparatus of (3), wherein the transmissive electrode area includes a plurality of portions in a region of the mesh-like electrode that are not included in the wiring line portion.

(5) The information processing apparatus of any of (1) to (4), further comprising: a non-transmissive electrode area connected to the wiring line portion of the transmissive electrode area.

(6) The information processing apparatus of (5), wherein the non-transmissive electrode area includes a pad having an exposed conductive portion.

(7) The information processing apparatus of (6), wherein the pad is connected to another circuit substrate or an electronic component.

(8) The information processing apparatus of (7), wherein the pad is connected to the other circuit substrate or the electronic component through an electrically conductive pin or an electrically conductive spring.

(9) The information processing apparatus of (6), wherein the pad is connected to a feeding point of an antenna.

(10) The information processing apparatus of any of (1) to (9), wherein the information processing apparatus is a mobile phone.

(11) The information processing apparatus of any of (1) to (10), wherein the transparent member is disposed between the first and second housings and is in direct contact with the first and second housings.

(12) The information processing apparatus of any of (1) to (11), wherein the transparent member extends along an entire lateral width of the first housing and the second housing.

(13) A transparent substrate comprising: a transmissive electrode area including a plurality of wiring line portions arranged side by side on a substrate formed of a transparent material, a width of each of the wiring line portions being set in accordance with a current to flow through the wiring line portion; and a non-transmissive electrode area disposed on the substrate, the non-transmissive electrode being connected to the wiring line portions of the transmissive electrode area.

(14) The transparent substrate of (13), wherein the wiring line portions are formed of a mesh-like electrode including a plurality of portions each having widths determined in accordance with an amount of current to flow in each of the plurality of portions.

(15) The transparent substrate of (14), wherein the transmissive electrode area includes a plurality of portions in a region of the mesh-like electrode that are not included in the wiring line portion.

(16) The transparent substrate of (13), further comprising: a non-transmissive electrode area connected to each of the wiring line portions of the transmissive electrode area.

(17) The transparent substrate of (16), wherein the non-transmissive electrode area includes a pad.

(18) The transparent substrate of (17), wherein the pad includes an exposed conductive portion.

The invention claimed is:

1. An information processing apparatus comprising:
 a first housing;
 a second housing;
 a transparent member disposed between the first and second housings; and
 a transparent substrate including a transmissive electrode area having a horizontally arranged mesh-like transparent electrode pattern divided into a plurality of electrodes by a plurality of vertically extending gap portions separating each of the plurality of electrodes, wherein
 a subset of the plurality of electrodes electrically connect an interior of the first housing and an interior of the second housing.

2. The information processing apparatus of claim 1, wherein
 the subset of the plurality of electrodes each have widths determined in accordance with an amount of current to flow in each of the subset of the plurality of electrodes.

3. The information processing apparatus of claim 2, wherein
 the transmissive electrode area includes a second subset of the plurality of electrodes that do not electrically connect the interior of the first housing and the interior of the second housing.

4. The information processing apparatus of claim 1, further comprising:
 a plurality of non-transmissive electrodes connected to each of the subset of the plurality of electrodes.

5. The information processing apparatus of claim 4, wherein
 each of the non-transmissive electrodes are connected to a pad having an exposed conductive portion.

6. The information processing apparatus of claim 5, wherein
 each of the pads is connected to another circuit substrate or an electronic component.

7. The information processing apparatus of claim 6, wherein
 each of the pads is connected to the other circuit substrate or the electronic component through an electrically conductive pin or an electrically conductive spring.

8. The information processing apparatus of claim 5, wherein
 at least one of the pads is connected to a feeding point of an antenna.

9. The information processing apparatus of claim 1, wherein
 the information processing apparatus is a mobile phone.

10. The information processing apparatus of claim 1, wherein
 the transparent member is disposed between the first and second housings and is in direct contact with the first and second housings.

11. The information processing apparatus of claim 1, wherein
 the transparent member extends along an entire lateral width of the first housing and the second housing.

12. A transparent substrate comprising:
 a transmissive electrode area including a horizontally arranged mesh-like transparent electrode pattern divided into a first plurality of electrodes by a plurality of vertically extending gap portions separating each of the first plurality of electrodes; and
 a non-transmissive electrode area disposed on the substrate, the non-transmissive electrode area including a second plurality of electrodes connected to a subset of the first plurality of electrodes of the transmissive electrode area.

13. The transparent substrate of claim 12, wherein
the subset of the first plurality of electrodes each have widths determined in accordance with an amount of current to flow in each of the subset of the first plurality of electrodes.

14. The transparent substrate of claim 13, wherein
the first plurality of electrodes include a plurality of electrodes that are not included in the subset of the first plurality of electrodes.

15. The transparent substrate of claim 12, wherein
each of the second plurality of electrodes is connected to a pad.

16. The transparent substrate of claim 15, wherein
each of the pads include an exposed conductive portion.

* * * * *